United States Patent
Takano et al.

(10) Patent No.: US 9,667,079 B2
(45) Date of Patent: *May 30, 2017

(54) CHARGE CONTROL DEVICE AND CHARGE TIME CALCULATION METHOD

(71) Applicant: NISSAN MOTOR CO., LTD., Yokohama-shi, Kanagawa (JP)

(72) Inventors: Atsushi Takano, Sagamihara (JP); Tsutomu Soga, Machida (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 113 days.

This patent is subject to a terminal disclaimer.

(21) Appl. No.: 14/426,296

(22) PCT Filed: Sep. 20, 2013

(86) PCT No.: PCT/JP2013/075449
§ 371 (c)(1),
(2) Date: Mar. 5, 2015

(87) PCT Pub. No.: WO2014/046233
PCT Pub. Date: Mar. 27, 2014

(65) Prior Publication Data
US 2015/0249355 A1    Sep. 3, 2015

(30) Foreign Application Priority Data

Sep. 21, 2012    (JP) .................................. 2012-208698

(51) Int. Cl.
*H02J 7/04* (2006.01)
*G01R 31/36* (2006.01)
(Continued)

(52) U.S. Cl.
CPC ......... *H02J 7/0052* (2013.01); *B60L 11/1809* (2013.01); *G01R 31/3648* (2013.01); *H02J 7/0047* (2013.01)

(58) Field of Classification Search
CPC ............................... H02J 7/0052; H02J 7/041
(Continued)

(56) References Cited

U.S. PATENT DOCUMENTS 5,192,905 A * 3/1993 Karlin ..................... H02J 7/022
320/145
5,568,040 A * 10/1996 Krainer ................. H02J 7/0073
320/150

(Continued)

FOREIGN PATENT DOCUMENTS

CN    102540088 A    7/2012
JP    11-018314 A    1/1999
(Continued)

*Primary Examiner* — M'Baye Diao
(74) *Attorney, Agent, or Firm* — Young Basile Hanlon & MacFarlane, P.C.

(57) ABSTRACT

A charge control device includes a charge state (SOC) calculation unit that calculates the SOC of a battery using the voltage and current of the battery. A chargeable power calculation unit calculates the power with which to charge the battery and a charge power calculation unit calculates the charge power to be supplied from the charger. A charge time calculation unit uses a map that correlates in part combinations of charge state values and charge power values to output charge time values is used by the charge state calculation unit when the chargeable power is greater than the outputtable power. When the chargeable power for charging is less than the outputtable power, the charge time calculation unit calculates the remaining charge time by using the map to reduce the remaining charge time determined from the map.

5 Claims, 9 Drawing Sheets

(51) Int. Cl.
*H02J 7/00* (2006.01)
*B60L 11/18* (2006.01)

(58) Field of Classification Search
USPC .......................................... 320/155; 702/63
See application file for complete search history.

(56) References Cited

U.S. PATENT DOCUMENTS

| | | | | |
|---|---|---|---|---|
| 6,057,671 | A | * | 5/2000 | Kuno .................... H02J 7/0091 320/130 |
| 2012/0013301 | A1 | | 1/2012 | Gaul et al. |
| 2012/0101754 | A1 | | 4/2012 | Halme |
| 2012/0130661 | A1 | * | 5/2012 | Hagimori ................ H02J 7/041 702/63 |

FOREIGN PATENT DOCUMENTS

| | | |
|---|---|---|
| JP | 2011091879 A | 5/2011 |
| WO | 2010100081 A2 | 9/2010 |

* cited by examiner

CHARGE CONTROL DEVICE AND CHARGE TIME CALCULATION METHOD

CROSS REFERENCE TO RELATED APPLICATION

The present application claims priority to Japanese Patent Application No. 2012-208698, filed Sep. 21, 2012, incorporated herein in its entirety.

TECHNICAL FIELD

The present invention relates to a charge control device and a charge time calculation method.

BACKGROUND

It is known to display a remaining charging time by using a map showing a relationship between the battery capacity accumulated in the battery and the battery terminal voltage to identify a battery capacity (SOC) that is charged at the current time from the terminal voltage, by storing a plurality of such maps corresponding to the plurality of charge currents, and by referring to the maps to acquire the remaining charge time corresponding to the SOC and the charge current (for example, see Japanese Patent Application Publication No. 2011-91879).

However, in the maps described above, the relationship shows a shorter remaining charge time as the charge current increases, and according to the calculation of the remaining charge time using the maps described above, when the charge current decreases during a charge process, as compared to the remaining charge time before the decrease in the charge current, the remaining charge time becomes longer. In other words, despite during charging, there is a problem that the calculated remaining charge time becomes longer.

SUMMARY

According to the present invention, it is intended to provide a charge control device and a charge time calculation method that may calculate the remaining charge time and prevents the remaining charge time from being increased for display in spite of being charged.

The present invention solves the problem described above, when the chargeable electric power of the battery is less than an outputtable power from a charger, by subtracting time depending on the charge state of the battery from the remaining charge time calculated from the map to calculate the remaining charge time of the battery.

According to the present invention, even when the charge power of the battery decreases, since the remaining charge time decreases with the passage of time during charging, the calculated remaining charge time is advantageously prevented from increasing.

BRIEF DESCRIPTION OF THE DRAWINGS

FIG. 5A is a graphs showing charge power characteristics, FIG. 5B is a graph showing power characteristics for calculation of the remaining charge time, FIG. 5C is a graph showing SOC characteristics, and FIG. 5D is a graph showing the characteristics of the remaining charge time.

DETAILED DESCRIPTION OF THE EMBODIMENTS

A description is given of an embodiment according to the present invention with reference to the drawings.

Figure 1:
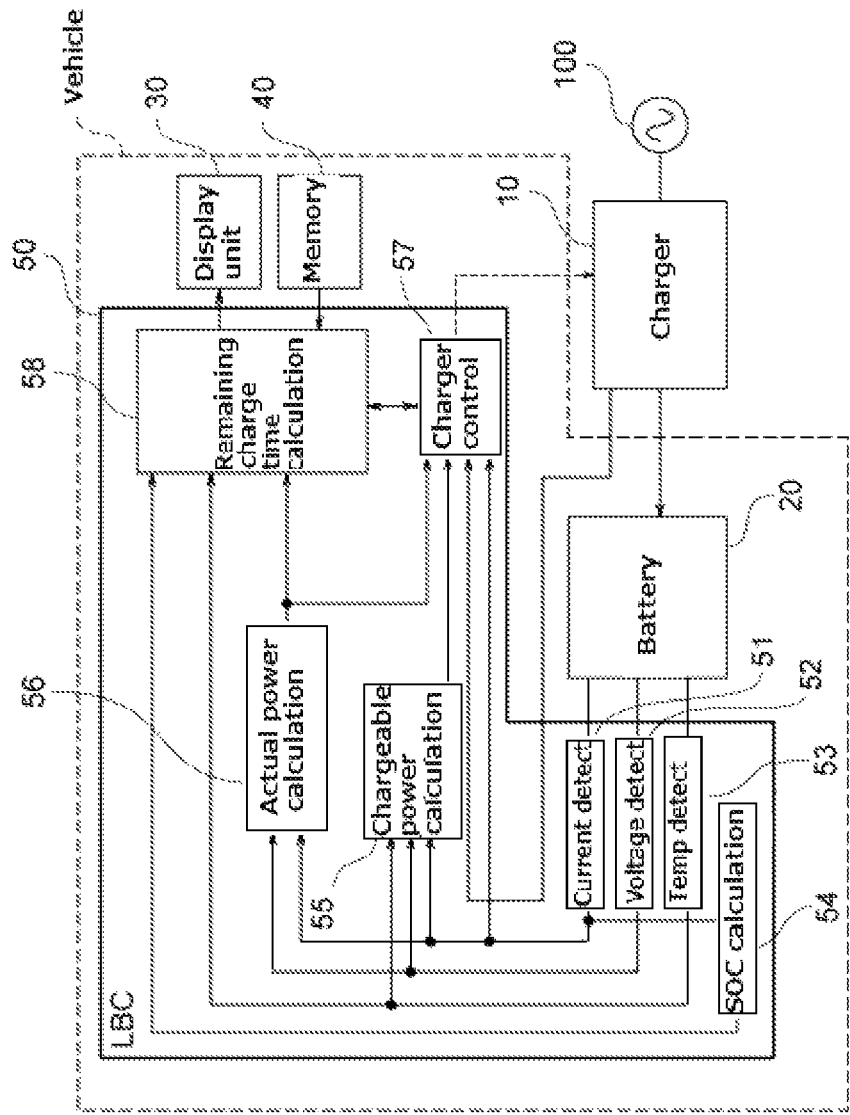
FIG. 1 is a block diagram of a charge system in an embodiment according to the present invention.

FIG. 1 is a block diagram of a charge system of the charge control device in an embodiment according to the present invention. The charge system in the present embodiment is intended for a charge system for charging a battery mounted on a vehicle such as an electric vehicle, a plug-in hybrid vehicle, etc. The charge control device is a part of a configuration of a charging system, which is mounted on the vehicle or the like.

The charge system of the present embodiment includes a charger 10, a battery 20, a display unit 30, a memory 40, and a LBC (Lithium-ion battery controller) 50. The battery 20, the display unit 30, the memory 40 and the LBC 50 are mounted on the vehicle. Note that, though not shown in FIG. 1, a vehicle equipped with the charge device is provided with a configuration such as an electric motor in addition to the battery 20, etc.

The charger 10 is intended for charging the battery 20 provided outside the vehicle. The charger 10 is a charge circuit for outputting to the battery 20 an electric power suitable for charging the battery 20, on the basis of the control of the LBC 50, by converting the power input from the AC power supply 100. The charger 16 is provided with an inverter, a DC/DC converter, and a controller or the like. The charger 10 is connected to the battery 20 by a cable or the like.

The battery 20 is composed of a plurality of secondary batteries (hereinafter, also referred to as cells) connected to each other and serving as a power source of the vehicle. The battery 20 is connected to a motor (not shown) via an inverter (not shown). The battery is charged by regeneration of the motor or by the charger outside the vehicle.

The display unit 30 is intended for displaying the remaining charge time for charging the battery 20. The remaining charge time shows the rest of the charge time until the current charge state (SOC: State of Charge, or charging rate) of the battery 20 reaches a target SOC. The display of the display unit 30 is controlled by the LBC 50. Note that the display unit 30 is not necessarily disposed in the vehicle, but may be disposed on a mobile phones held by the user, or may be mounted on a charge device including the charger 10, for example. In addition, the remaining charge time may also be described simply as the charge time in the following.

The memory 40 is storage medium for storing or recording information about the state of the battery 20. The information stored in the memory 40 is managed by the LBC 50. Note that the information stored in the memory 40 will be described later.

The LBC 50 is a controller that measures the SOC and the like of the battery 20 based on detection values of a voltage sensor and a current sensors connected to the battery 20 for managing the states of the battery 20 such as a charged capacity to the battery 20 and the like. Further, the LBC 50 communicates control signals with the charger 10 and controls charging of the battery by controlling the charger 10.

The LBC 50 is provided with a current detecting unit 51, a voltage detecting unit 52, a SOC calculation unit 54, a chargeable power calculation unit 55, an actual charge calculation unit 56, a charger control unit 57, and a remaining charge time calculation unit 58.

The current detecting unit 51 is a sensor connected to the battery 20 for detecting the current of the battery 20. The detection value of the current detecting unit 51 is output to the SOC calculation unit 54, the chargeable power calculation unit 55, the actual power calculation unit 56, and the charger control unit 57, respectively, detects each voltage of the plurality of battery cells included in the battery 20.

The Voltage detecting unit 52 is connected to the battery 20 and intended to be a sensor that detects the voltage of the battery 20. The voltage detecting unit 52 detects each voltage of a plurality of the battery cells in the battery 20, and detects the total voltage of the plurality of batteries. The detected values of the voltage detecting unit 52 are outputted to the chargeable power calculation unit 55 and the actual power calculation unit 56.

The temperature detecting unit 53 is disposed in the battery 20 and intended to be a sensor for detecting the temperature of the battery 20. The detection value of the temperature detecting unit 53 is output to the chargeable power calculation unit 55, the actual power calculation unit 56, and the charger control unit 57.

The SOC calculation unit 54 calculates the SOC of the battery 20, by integrating the detected value detected by the current detecting unit 51, i.e., by integrating the charge current, calculates the SOC of the battery 20. The SOC calculation unit 54 outputs the calculated SOC to the charger control unit 57 and the remaining charge time calculation unit 58.

Note that the SOC calculation unit 54 may calculate the SOC of the battery 20 from the detected voltage of the voltage detecting unit 52. Since the voltage of the battery 20 and the SOC are correlated, a map indicating the correlation is stored in the memory 40. The SOC calculation unit 54, by referring to the map in the memory 40, calculates the SOC corresponding to the detected value of the voltage detecting unit 52 as the SOC of the battery 20.

Note that, since the correlation between the voltage of the battery 20 and the SOC varies depending on the degree of deterioration of the battery 20, the map may be prepared in accordance with the degree of deterioration of the battery 20. The degree of deterioration of the battery 20 may be calculated from the internal resistance of the battery 20, for example.

The chargeable power calculation unit 55 calculates a chargeable power of the battery 20 based on the detected current of the current detecting unit 51, the detected voltage of the voltage detecting unit 52, and the detected temperature of the temperature detecting unit 53. The chargeable power means a maximum power, during charging of the battery 20, with which the battery may be charged without promoting deterioration of the battery 20, i.e. the maximum input power inputtable from the charger 10 to the battery 20. Note that the chargeable power is generally referred to an inputtable power, maximum chargeable power, or maximum inputtable power, as well. In the present embodiment, it is described as the chargeable power. The chargeable power calculation unit 55 calculates the chargeable power in the manner described below.

With respect to the battery 20, according to the performance of the battery 20, a charge voltage upper limit is set for each cell. The charge voltage upper limit is intended to be such an upper limit voltage at which the battery 20 is charged without causing deterioration of the battery 20. The charge voltage upper limit is set to a voltage equal to or lower than that voltage at which the lithium precipitation begins in the battery (cell) constituting the battery 20.

The charge voltage upper limit is calculated in accordance with the charge current input to the battery 20, a battery temperature, and the internal resistance of the battery 20. For example, the charge voltage upper limit is set lower as the charge current of the battery 20 increases, while calculated higher as the charge current to the battery 20 is smaller.

When the battery 20 is composed of a plurality of batteries, the highest voltage among the plurality of battery cells must be suppressed under the charge voltage upper limit. The chargeable power calculation unit 55 specified the cell with the highest voltage among voltages of cells detected by the voltage detecting unit 52. The chargeable power calculation unit 55 calculates an inputtable current which can be input to the battery based on the voltage of the specified cell, the internal resistance of that cell, and the internal resistance, charge current and chargeable upper voltage of the cell.

The inputtable current is calculated from the internal resistance of the cell with the highest terminal voltage and the charge voltage upper limit of that cell. The internal resistance of the cell is calculated from the terminal voltage of that cell by the voltage detecting unit 52 and the charge current of that cell.

Figure 2:
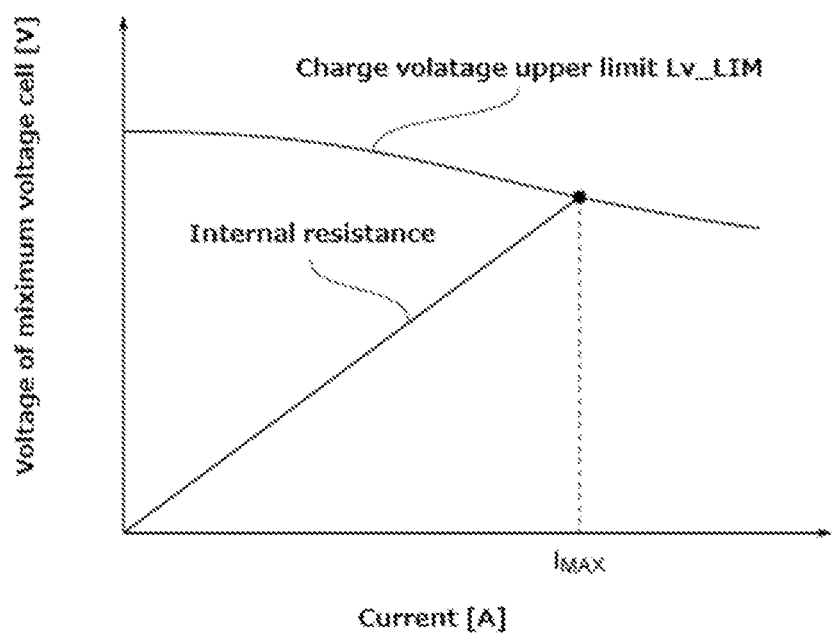
FIG. 2 is a graph showing voltage characteristics of the maximum voltage cell with respect to a charge current of the battery.

FIG. 2 is a diagram that explains the calculation method of the inputtable current ($I_{MAX}$). The chargeable power calculation unit 55 calculates, as shown in FIG. 2, the internal resistance line $L_R$ from an internal resistance of the cell that exhibits the highest terminal voltage.

The internal resistance line $L_R$ is representative, with respect to the cell having the highest terminal voltage, of a straight line indicating the relationship between the charge current of that cell and the voltage of the cell. Note that the internal resistance wire $L_R$ can be calculated, for example, from the total internal resistance of the battery 20 and the open circuit voltage of the battery 20. The total internal resistance of the battery 20 is the total resistance values of the plurality of cells included in the battery 20.

The charge voltage upper limit line $L_{V\_LIM}$ correlates to a charge current of the battery 20. Therefore, by preparing the map with the correlation between the charge voltage upper limit with the charge current of the battery 20 stored previously in the memory 40, the chargeable power calculation unit 55 may refer to the map and use the detected current of the current detecting unit 51 to calculate the charge voltage upper limit (corresponding to the charge voltage upper limit line $L_{V\_LIM}$).

In the characteristics shown in FIG. 2, the current at the intersection between the charge voltage upper limit line $L_{V\_lim}$, and the internal resistance line $L_R$, represents the inputtable current with the highest terminal voltage. Thus, the inputtable current can be calculated by chargeable power calculation unit 55.

The chargeable power calculation unit 55 can calculate the chargeable power by multiplying the total internal resistance of the battery 20 the square of the inputtable current ($I_{MAX}$). Note that the calculation method of the chargeable power may be based on a method other than the method above.

The chargeable power calculation unit 55 outputs the calculated chargeable power to the charger control unit 57.

Reverting to FIG. 1, an actual power calculation unit 56 is intended for calculating the charge power being actually supplied from the charger 10 to the battery 20. Against the output of the charger, which is set on the side of the charger 10, the charge power actually supplied to the battery 20 will be lower than the output power of the charger 10 due to the internal resistance of the battery 20. The actual power is calculated by the detected current of the current detecting unit 51 and the detected voltage of the voltage detecting unit 52. The actual power calculation unit 56 outputs the calculated charge power to the charger control unit 57.

The charger control unit 57 in turn controls the charger 10 based on the detected current of the current detecting unit 51, the chargeable power calculated by the chargeable power calculation unit 55, the charge power calculated by the actual power calculation unit 56, and the outputtable power of the charger 10.

The outputtable power of the charger 10 corresponds to the rated power of the charger and represents the maximum power which can be output from the charger. In other words, the output power can be a value that is previously set according to the charging capacity of the charger 10, and the output power of the charger 10 is limited to less than the potential, outputtable power output. The outputtable power of the charger 10 is different depending on the charger 10. Therefore, when the charger 10 and the battery 20 are connected by cable or the like, the charger control unit 57 communicates with the charger 10 to obtain information on the outputtable power of the charger 10. Note that the communication between the charger 10 and the charger control unit 57 may be performed by using a communication line in the cable connecting the charger 10 and the battery 20.

The remaining charge time calculation unit 58 calculates the remaining or residual charge time based on the detected temperature of the temperature detecting unit 53, the SOC calculated by the SOC calculation unit 54, the charge power calculated by the actual power calculation unit 56. The remaining charge time calculation unit 58 displays the calculated remaining charge time on the display unit 30.

Now, a description is given of the control of the charge system in the present embodiment. First, the charge control is described when charging the battery 20.

The LBC 50, upon receipt of a signal indicative of charge start of the battery 20 by the charger 10, sets a target charging rate, and starts charging after confirming the connection between the charger 10 and the battery 20.

The charger control unit 57 acquires from the charger 10 the potential power output or outputtable power of the charger 10. In addition, the charger control unit 57 acquires the chargeable power calculated by the chargeable power calculation unit 55. Then, the charger control unit 57 compares the outputtable power and the chargeable power, and set the supply power supplied from the charger 10 to the battery 20 based on the comparison result and the SOC of the battery 20.

The battery 20 of the present embodiment is a secondary battery mounted on a vehicle, etc., and the battery capacity of the battery 20 is large. Thus, the charger 10 has a limit to increasing the potential power output or outputtable power through increase in rated power of the alternate power source 100 and boost voltage of a converter of the charger. Therefore, when the SOC of the battery 20 is low, the outputtable power of charger 10 becomes lower than the chargeable power of the battery 20.

When the SOC of the battery 20 is high, the inputtable power to the battery 20 is low. Therefore, the chargeable power of the battery 20 is lower than the outputtable power of the charger 10.

When the chargeable power of the battery 20 is above the outputtable power of the charger 10, the charger control unit 57 sets the supply power supplied to the battery 20 from the charger 10 to the outputtable power of the charger 10, and transmits a signal indicative of a command power to the charger 10. In response to that signal, the charger 10 starts to charge the battery at the outputtable power. Thus, the battery 20 is charged by the constant power charging control.

On the other hand, when the chargeable power of the battery 20 is less than the outputtable power of the charger 10, the charger control unit 57 sets the supply power supplied from the charger 10 to the battery 20 to the chargeable power of the battery, and transmits the signal indicative of a command power to the charger 10. In response to that signal, the charger 10 in turn charges the battery 20 while decreasing the output current from the charger 10 so as to be lower than the outputtable power.

The chargeable power calculation unit 55 calculates, during charging of the battery 20, the chargeable power of the battery 20 based on the detected value of the current detecting unit 51, etc., for transmitting to the charger control unit 57. When charging has been started with the chargeable power of the battery 20 being higher than the outputtable power of the charger 10, the charger control unit 57 compares, during charging of the battery 20, the chargeable power of the battery 20 and the outputtable power of the charger 10. Upon the chargeable power falling below the outputtable power, the charger control unit 57 controls the charger 10 so that the supply power from the charger 10 to the battery 20 will be less than the outputtable power of the charger 10. In response to a control signal from the charger control unit 57, the charger 10 decreases the output current from the charger 10 to decrease the supply power to the battery 20. Further, along with increase in the SOC of the battery 20, the charger control unit 57 controls the charger 10 so that the supply power to the battery 20 will be decreased gradually. The charger decreases the output current gradually in accordance with increase in the SOC of the battery 20 while keeping the output voltage constant. Thus, the battery 20 will be charged under the constant voltage control.

The charger control unit 57 manages, during the constant voltage control, the charge current of the battery 20 by the detected value of the current detecting unit 51. The charger control unit 57 is set with a current threshold (Ib) for switching to an additional charge control from the constant voltage control.

When the constant voltage control is continued and the voltage of the battery 20 increases to approach the full charge of the battery 20, due to polarization of the battery 20, it is difficult for the current from the charger 10 to flow to the battery 20. Therefore, the charger control unit 57 switches, when the charge current from the battery 20 falls below the current threshold (Ib), to the additional charge control to continue to charge the battery 20 so as to fully charge the battery 20.

When the charge current of the battery 20 falls below the threshold current (I b), the charger control unit 57 transmits a signal including a sequence of the additional charge control to the charger 10. The charger 10 in turn, upon receipt of the signal including that sequence, switches from the constant voltage control to the additional charge control. The sequence includes the output timing and the output value from the charger 10. The charger 10 controls the outputs based on the sequence.

Note that, in this case, the situation in which the charge current of the battery 20 falls below the current threshold (Ib) may be alternatively detected by identifying the time at which the rate (rate of change) of the SOC calculated by the SOC calculation unit 54 falls below a predetermined rate of change. In other words, when the charge current to the battery 20 is small, since the charge power in the battery is also small, it is possible to detect that the charge current becomes less than the current threshold (Ib) based on the rate of change in the battery SOC.

The additional charge control is intended for stopping the charger to output for a predetermined time, and following the elapse of the predetermined time, for outputting the charge current from the charger to the battery. Here, an operation with the stop period for stopping the output from the charger 10 and an operation with the output period of the charging current are combined in the set. One additional charge control involves performing that combined set of operations. As the number of the additional charges increases, the stop period becomes gradually shorter, and the peak value of the pulse current gradually decreases.

The number of the additional charges is determined in advance by the specifications etc. of the battery 20, such as the battery capacity at full charge. Similarly, even the stop period and the peak value of a single cycle of the additional charge are respectively determined in advance by the specifications of the battery 20.

In the sequence of the additional charge control, it is possible to carry out a plurality of the set of the additional charge for outputting intermittently from the charger 10.

The charger 10 outputs a power intermittently by carrying out the additional charge a plurality of time, which is determined by the sequence. The charger control unit 57 manages the number of the additional charges by an additional charge counter from switching from the constant voltage control to the additional charge control. Further, the charger control unit 57 increments the additional charge counter from the time of switch from the constant voltage control to the additional charge control along with passage of time. Then, upon the additional charge counter incrementing to the predetermined number defined by the sequence, a full charge flag is set and charging of the battery 20 ends.

Now, a description is given of the calculation control of the remaining charge time of the battery 20.

Figure 3:
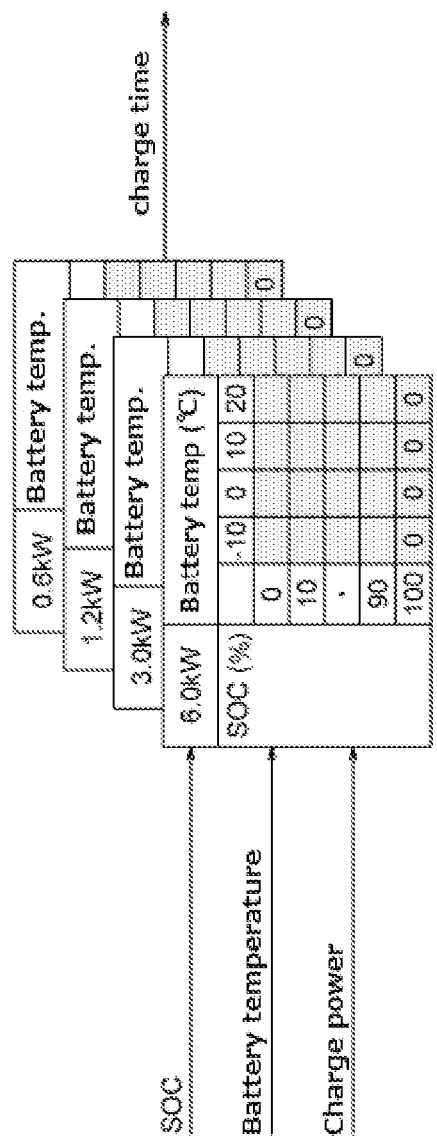
FIG. 3 is a schematic diagram of a map that is stored in a memory shown in FIG. 1.

A plurality of maps shown in FIG. 3 is stored in the memory 40 in advance. FIG. 3 is a schematic diagram of a map showing the charge time in relation to the charge power of the battery 20, the battery temperature and SOC.

As shown in FIG. 3, the remaining charge time of the battery 20 correlates to the charge power of the battery 20, the battery temperature and the SOC. More specifically, the higher the temperature of the battery 20 the charge time becomes longer. The charge time becomes longer as the SOC is lower. In addition, as the charge power to the battery 20 decreases, the charge time increases. The charge time indicates the rest of the charge time (i.e. remaining charge time) of the battery 20 until the charge state of the battery reaches the target SOC. Therefore, when the target SOC is set to the SOC at full charge, the charge time indicates the time period required for the current charge capacity of the battery 20 to reach the battery capacity at full charge.

The remaining charge time calculation unit 58, when the chargeable power of the battery 20 is above the potential power output or the outputtable power of the charger 10, in other words, when charging the battery 20 with the constant power control, refers to the map in FIG. 3 and calculates the remaining charge time of the battery 20 based on the charge power of the battery 20 calculated by the actual power calculation unit 56, the SOC and the temperature of the battery 20.

More specifically, the remaining charge time calculation unit 58 extracts from the plurality of maps stored in the memory a map corresponding to the charge power calculated by the actual power calculation unit 56. Since, in the constant voltage control, the battery 20 is charged at the outputtable power of the charger 10, the charge power of the battery 20, when the output power of the charge 10 is set to the outputtable power, will be a power actually supplied to the battery 20. Therefore, when connected to the charger with high outputtable power 10, the remaining charge time calculation unit 58 will extract a map with high charge power.

The remaining charge time calculation unit 58 refers to the extracted map and calculates the remaining charge time of the battery 20 by extracting the charge time that corresponds to the temperature detected by the temperature detecting unit 53 and the SOC calculated by the SOC calculation unit 54. Then, the remaining charge time calculation unit 58 causes the display unit 30 to display the remaining charge time thus calculated.

The remaining charge time calculation unit 58 performs the above calculation in a predetermined cycle, and, for each computation, the charge time will be indicated on the display unit 30. In the constant power control, the charge power of the battery 20 remains constant. Therefore, the remaining charge time calculation unit 58 calculates the remaining charge time, during the constant power control on the same extracted map. Thus, the remaining charge time indicated on the display unit 30 will be shorter gradually with increase in the SOC.

When the SOC of the battery 20 increases, and the chargeable power of the battery 20 is less than the outputtable power of the charger 10, as described above, charging control of the battery 20 transitions from the constant power control to constant voltage control.

Figures 4, 5:
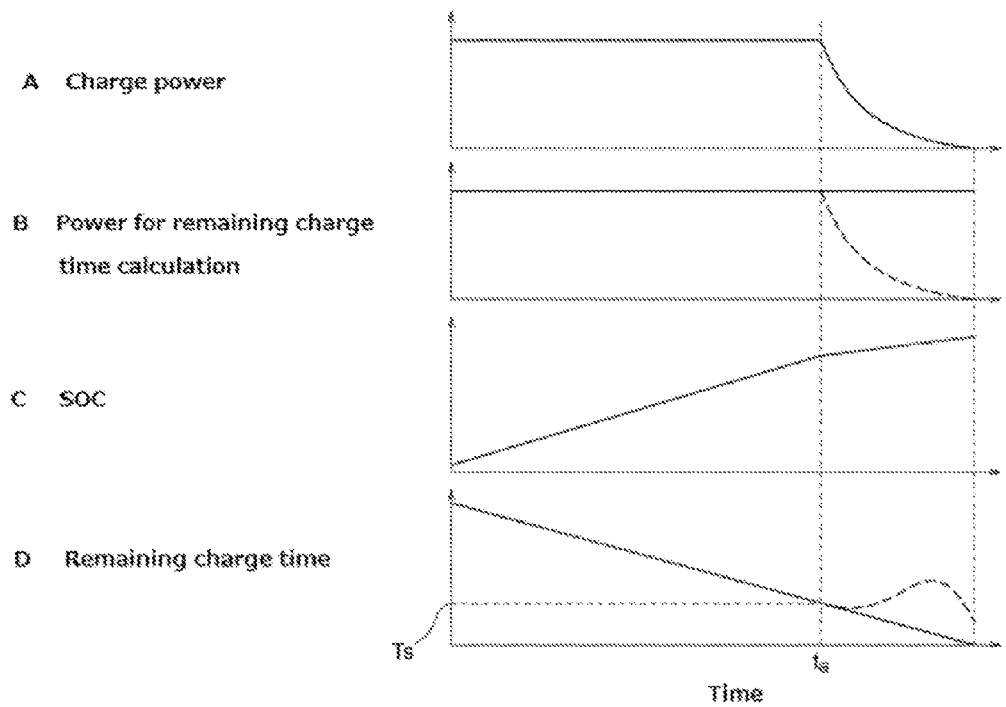
FIG. 4 is a schematic diagram of a map that is stored in a memory shown in FIG. 1.

Now, a description is given of the remaining charge time of the constant voltage control. First, in the constant voltage control, a description is given with reference to FIG. 4 of a case (hereinafter referred to as Comparative Example 1) in which the remaining charge time is calculated based on the charge power of the battery with reference to the map in the memory. FIG. 4 is a map showing the SOC and the charge power with the battery temperature set at zero degree in the map of FIG. 3. In Comparative Example, in the constant voltage control, the power output from the charger 10 is decreased and the charge power of the battery 20 gradually decreases, The remaining charge time calculation unit 58 extracts a map in the memory 40 based on the charge power of the battery 20, thus is configured to select a map with lower charge power with decreasing power.

During the constant voltage control, the current output from the charger 10 falls discretely. Thus, the charge power of the battery 20 also drops in discrete. For example, it is assumed that, due to decrease in output power of the charger 10, the charge power of the battery 20 decreases from 3.3 kW (the power immediately before the time of switch from the constant power control to the constant voltage control) to 1.2 kw, and after the lapse of a predetermined time, further decreases from 1.2 kw to 0.6 kw. Also, the SOC of the battery 20 is assumed 60% before and after the decrease of charge power from 3.3 kW to 1.2 kW. Further, the SOC of the battery 20 is assumed 80% before and after the decrease of charge from 1.2 kW to 0.6 kW.

Here, for ease of explanation, in the above listed exemplary figures, as shown in FIG. 4, the power is lowered from 3.3 kW to 1.2 kW, or from 1.2 kW to 0.6 kW. However, in the embodiment, the amount of change in power during the constant voltage control is set to an arbitrary value.

Whereas, at 3.3 kW (SOC 60%), the remaining charge time of the battery 20 which is calculated by the map is 165 minutes, when decreased to 1.2 kW from 3.3 kW, the remaining charge time rises from 165 minutes to 428 minutes. Further, at 1.2 kW (SOC 80%), the remaining charge time of the battery 20 which is calculated by the map is 175 minutes, whereas when decreased to 0.6 kW from 1.2 kW, the remaining charge time rises from 175 minutes to 342 minutes.

That is, in Comparative Example 1, before and after the decrease in the output power, with the same SOC of the battery 20 and the same battery temperature, when the charge power of the battery 20 is lower, the remaining charge time of the battery 20 is increased. During the constant voltage control, since the output power of the battery 20 is gradually lowered, every time the output power is lowered, the remaining charge time becomes longer. In Comparative Example 1, despite the charging of the battery 20 in progress, since the remaining charge time displayed increases on the display unit 30, a problem of discomfort to the user arises who watches the remaining charge time on the display unit 30.

In the present invention, the remaining charge time calculation unit 58 performs the calculation control of the remaining charge time in the constant power control and the calculation control of the remaining charge time in the constant voltage control in different methods from each other. When switching from the constant power control to the constant voltage control, based on a signal from the charger control unit 57, the remaining time calculation unit 58, immediately before the switching from the constant power control to the constant voltage control, fixes the map that has been extracted based on the charge power at that time. Then, the remaining charge time calculation unit 58 calculates the remaining charge time based on the fixed map without switching the map despite the power drops due to the constant voltage control.

The remaining charge time calculation unit 58 obtains the SOC of the battery 20 in the constant voltage control from the SOC calculation unit 54 and the temperature of the battery 20 from the temperature detecting unit 53, respectively. Then, the remaining charge time calculation unit 58, by referring to the fixed map, calculates the charge time corresponding to the SOC and the temperature, calculated as the remaining charge time.

For example, in the same manner as in Comparative Example 1, in the constant voltage control by the LBC 50 according to the present invention, it is assumed that the charge power decreases from 3.3 kW (the power immediately before the time of switch from the constant power control to the constant voltage control) to 1.2 kw with further assumption that the battery temperature is at zero degree. Further, it is assumed that the SOC at the time of switching from the constant power control to the constant voltage control is 60%, while the SOC at the time of charge power being decreased from 1.2 kW to 0.6 kW is 80%.

The remaining charge time calculation unit 58 fixes the map (map of 3.3 kW) which has been referred to in the constant power control. Further, due to the constant voltage control, although the charge power of the battery 20 decreases to 1.2 kW, the remaining charge time calculation unit 58 calculates the remaining charge time by using the fixed map. After the charge power of the battery 20 has decreased to 1.2 kW, during charging for a predetermined time, the SOC of the battery 20 increases from 60% with passage of time. The remaining charge time calculation unit 58 calculates the remaining charge time (165 minutes) on the map of 3.3 kW (see FIG. 4) by corresponding to the SOC (60%) at the switching from the constant power control to the constant voltage control. Further, during the constant voltage control (during charging at 1.2 kW), when the SOC reaches 70%, the remaining charge time calculation unit 58 calculates the remaining charge time (119 minutes) on the map of 3.3 kW (see FIG. 4) by corresponding to the SOC (70%).

When the charge power of the battery 20 drops from 1.2 kW to 0.6 kW, the SOC is increased to 80%, the remaining charge time calculation unit 58 calculate the remaining charge time (73 minutes) on the map of the fixed 3.3 kW (see FIG. 4) by corresponding to the SOC (80%). Accordingly, the remaining charge time during the constant voltage control will decrease form 165 minutes, 119 minutes, to 73 minutes over time with increase in SOC.

Then, the remaining charge time calculation unit 58 causes the display unit 30 to indicate the remaining charge time, which decreases in response to the SOC.

That is, in the present embodiment, when the chargeable power of the battery 20 falls below the outputtable power of the charger 10 and the constant power control switches to the constant voltage control, the remaining charge time control unit 58 calculates the remaining charge time during the constant voltage control by reducing the time with increase in the SOC from the remaining charge time at the time of switching from the constant power control to the constant voltage control in the map used in the constant power control. Thus, according to the present invention, even when the charge power of the battery 20 is decreased due to the constant voltage control, contrary to Comparative Example, the remaining charge time will not increase upon switching of the map. As a result, the problem will be resolved that, despite charging of the battery 20, the remaining charging time displayed on the display unit 30 is increased and the user looking at the remaining charge time on the display unit 30 will be confronted with discomfort.

With reference to FIG. 5, in Comparative Example 1 and the present invention, a description is now given of changes in the remaining charge time in the constant power control and constant voltage control. FIG. 5A is a graphs showing charge power characteristics over time, FIG. 5B is a graph showing power characteristics for calculation of the remaining charge time, FIG. 5C is a graph showing SOC characteristics over time, and FIG. 5D is a graph showing the characteristics of the remaining charge time, respectively. In each graph, the solid line shows the characteristics according to the present invention, and the dotted line shows the characteristic of Comparative Example. The time (ta) indicates the time at which the charge power of the battery 20 reaches the outputtable power of the charger 10.

The power for calculation of the remaining charge time is a charge power of the battery 20, that is used in the remaining charge time calculation unit 58 when referring to the map. As shown in FIG. 5A, before the time (ta), since the constant power control is in place, the charge power to the battery is constant. At the time (ta) and later, since the constant voltage control is performed, the charge power of the battery 20 decreases over time.

During constant power control, as shown in FIG. 5B, since the charge power to the battery 20 is constant, the power used by the remaining charge calculation unit 58 to select a map in the memory 40 (power for calculation of the remaining charge time) is constant. As shown in FIG. 5C, the SOC increases over time. Because the power for calculation of the remaining charge time is constant, the map for calculation of the remaining charge time remains fixed. Therefore, as shown in FIG. 5D, the remaining charge time decreases along with the increase of the SOC.

With respect to the constant voltage control on Time (ta) and later, in Comparative Example 1, during the constant voltage control as well, a map is selected based on the charge power of the battery 20 for calculating the remaining charge time. Therefore, as shown in FIG. 5B, in Comparative Example 1, the power for calculation of the remaining charge time is reduced at the same locus as the characteristics of the charge power of the battery 20. Then, as shown in FIG. 5D, in Comparative Example 1, with the reduction in the power for calculation of the remaining charge time, since the switching of the map is performed, despite during charging, the remaining charge time increases.

On the other hand, in the present invention, at the time (ta) and later, although the charge power of the battery 20 decreases, the remaining charge time calculation unit 58 is configured to fix the charge power at the time of (ta) as the power for calculation of the remaining charge time (see FIG. 5B). In addition, the remaining charge time calculation unit 58 calculates the remaining charge time by reducing the time in accordance with the SOC from the remaining charge time that has been calculated by referring to a map in the memory at the time of time (ta). Therefore, in the present invention, as shown in FIG. 5D, the remaining charge time develops to decrease from the remaining charge time calculated by referring to a map at the time of time (ta) along with increase of SOC.

Now, a description is given of the additional charge control. Based on a signal from the charger control unit 57, when the constant voltage control transfers to the additional charge control, the remaining charge time calculation unit 58 subtracts from the remaining charge time calculated immediately before transition to the additional charge control (i.e. the remaining charge time that has been calculated by the remaining charge time calculation unit 58 at the time at which the charge current of the battery 20 has reached the current threshold (Ib)) according to the number of the additional charges to calculate the remaining charge time during the additional charge control. Since the number of the additional charges is previously specified by the sequence involved, the remaining charge time calculation unit 58 subtracts time so that, when the number of additional charges reaches the number specified by the sequence determined from the sequence and the last additional charge has ended, the remaining charge time will reach zero. Also, the time width to be subtracted per additional charge cycle may be a fixed value or may correspond to the time duration per additional charge cycle to be specified by the sequence.

The charger control unit 57 manages the number of times of the additional charge, and transmits a signal to the remaining charge time calculation unit 58 every time to increment the additional charge counter. The remaining charge time calculation unit 58 similarly manages the number of the additional charges based on that signal. Further, the remaining charge time calculation unit 58 subtracts the remaining charge time at the time of incrementing the additional charge counter for updating the time displayed on the display unit 30. In addition, the remaining charge time calculation unit 58, when the additional charge counter counts the number of the additional charges specified by the sequence and confirms that a full-charge flag is set, is configured to set the remaining charge time to zero.

Figure 6:
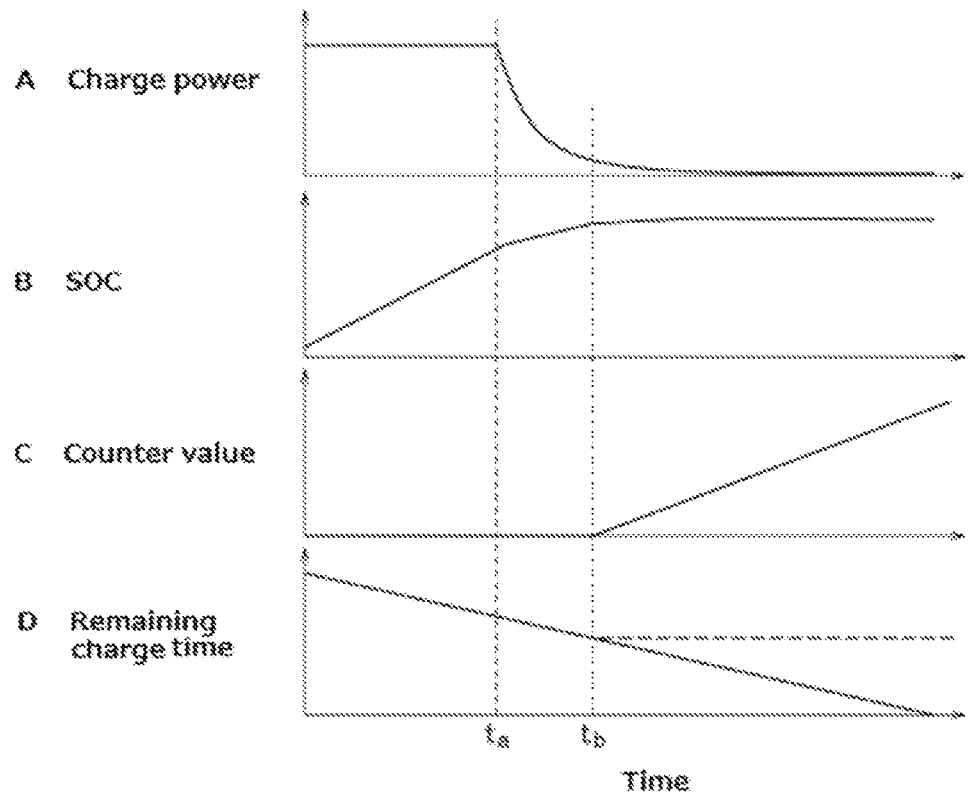
FIG. 6A is a graph showing charge power characteristics.
FIG. 6B is a graph showing SOC characteristics.
FIG. 6C is a graph showing the characteristics of an additional charge counter.
FIG. 6D is a graph showing remaining charge time characteristics.

With reference to FIG. 6, in Comparative Example 2 and the present invention, a description is given of changes in the remaining charge time during the charge control. FIG. 6A is a graph showing charge power characteristics, FIG. 6B is a graph showing SOC characteristics over time, FIG. 6C is a graph showing the characteristics of the additional charge counter over time, and FIG. 6D is a graph showing remaining charge time characteristics over time, respectively. In each graph, the solid line shows the characteristics according to the present invention, and the dotted line shows the characteristic of Comparative Example 2. The time (ta) indicates the time at which the charge power of the battery 20 reaches the outputtable power of the charger 10. Also, the time (tb) indicates the time at which the charge current of the battery 20 reaches the current threshold (Ib). In Comparative Example 2, at time (tb) and later, the remaining charge time is subtracted in accordance with the calculated value of SOC so that the remaining charge time will be caused to decrease along with increase in the calculated SOC.

During the additional charge control, as shown in FIG. 6A, since the battery is supplied intermittently with a current, the charge power to the battery 20 is indicated at a value near zero. Also, as shown in FIG. 6B, since the SOC of the battery 20 is already in a charge state near the full-charge SOC and the charge power to be supplied to the battery 20 is low, the SOC at and after the time (tb) assumes a high and almost constant value.

In Comparative Example 2, since the remaining charge time after time (tb) is calculated according to the calculated SOC and the amount of change in the SOC after time (tb) is small, the remaining charge time also takes a constant value. In other words, despite charging being in progress by the additional charge, the remaining charge time will not decrease, but assumes a constant time.

On the other hand, in the present embodiment, by subtracting the remaining charge time according to the number of additional charge, the remaining charge time after time (tb) is calculated. As shown in FIG. 6 C, at the time (t b) and later, the additional charge counter is incremented over time at and after the time (tb). Therefore, as shown in FIG. 6D, along with incrementing of the additional charge counter (i.e., over time), the remaining charge time decreases.

Now, a description is given of charge current and the remaining charge time of a battery 20 to supply power to a driving motor for a vehicle (not shown). The charge current to be charged to the battery 20 by a charger 10 amounts to a wide area (range) of current value between about 0.3 mA and 1.0 A. Thus, a current sensor (current detecting unit 51) that is intended to detect a current in the wide range exhibits a poor detection accuracy when detecting a small change of current (due to low sensor resolution). Further, as shown in Comparative Example 2, when calculating the remaining charge time according to the calculated SOC, which is calculated from the detected value of that current sensor, due to the detection error in the current sensor, despite during the charging, there is a possibility that the remaining charge time increases.

In the present embodiment, at the time at which the charge current of the battery 20 reaches the current threshold (Ib), the remaining charge time that has been calculated during the constant voltage control is subtracted according to the number of additional charges and subtracted over time, the remaining charge time is obtained. Thus, in the present embodiment, even when the battery 20 is near replete of charge and at a small amount of SOC change, contrary to Comparative Example 2, during the additional charge period, the remaining charge time will not be constant or increase due to errors in the current sensor.

Consequently, despite charging process of the battery 20, such a problem will be avoided to occur that, despite the charging process of the battery 20 being in place, the remaining charge time displayed on the display unit increases, or the remaining charge time will not decrease over time so that the user is given discomfort feeling.

Figure 7:
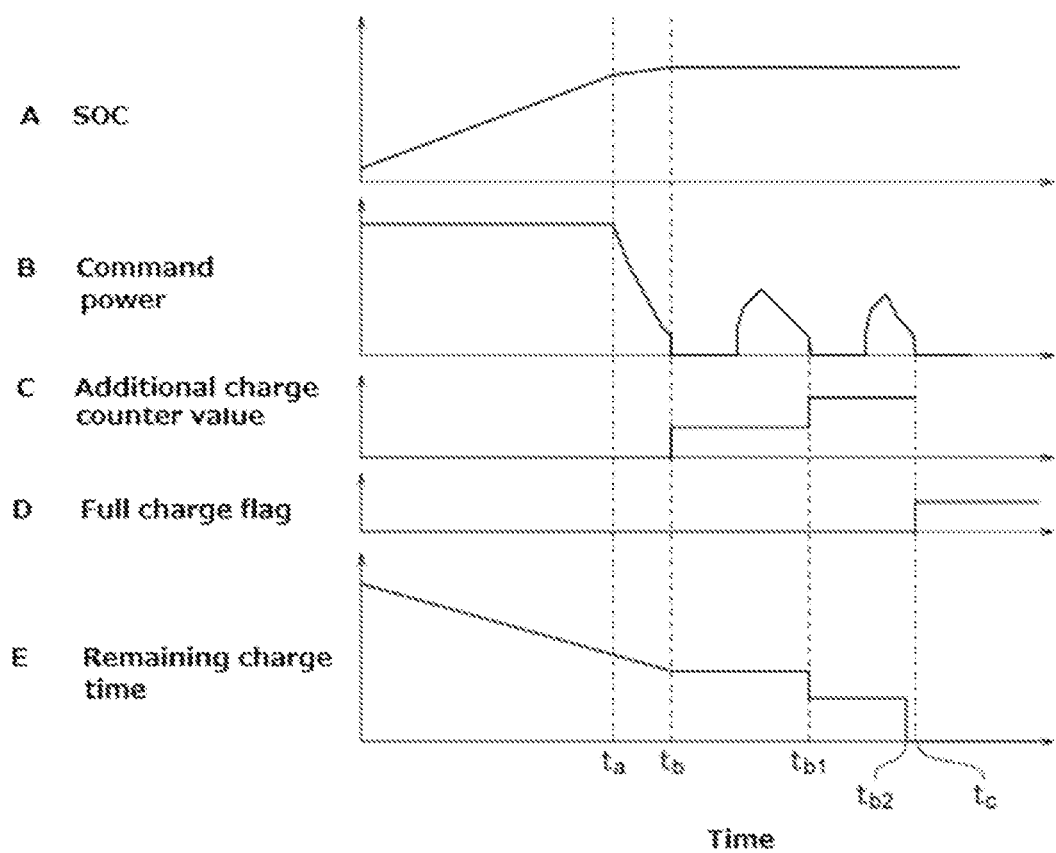
FIG. 7A is a graph showing SOC characteristics.
FIG. 7B is a graph showing the specified power characteristics.
FIG. 7C is a graph showing the characteristics of the additional charge counter.
FIG. 7D is a characteristic that shows characteristics of full-charge flag.
FIG. 7E is a graph showing the characteristics of the remaining charge time.

With reference to FIG. 7, a description is now give of the state of the battery 20 and the remaining charge time in the charge control in the present embodiment. FIG. 7A is a graph showing SOC characteristics over time, FIG. 7B is a graph showing the command power characteristics, FIG. 7C is a graph showing the characteristics of the additional charge counter, FIG. 7D is a characteristic that shows the characteristics of a full-charge flag over time, and FIG. 7E is a graph showing the characteristics of the remaining charge time over time, respectively. The command power is a command value which is output from the charger control unit 57 to the charger 58 and corresponds to a power value indicated by the sequence in the additional charge control.

The time (ta) indicates the time at which the chargeable power of the battery 20 reaches the outputtable power of the charger 10. Also, the time (tb) indicates the time at which the charge current of the battery 20 reaches the current threshold (Ib). The time (tb1) indicate the time of completion of a first additional charge, the time (tb2) indicates the time of completion of a second additional charge, and the time (tc) indicate the time of full-charge. Note that the time (ta) and the time (tb) correspond to the time (ta) in FIG. 5 and the time (tb) in FIG. 6, respectively.

During the constant power control, while the command power is held constant, the SOC of the battery 20 increases and the remaining charge time decreases. At time (ta), due to the constant voltage control, the command power decreases gradually. Although the command power is on the decrease, the battery is supplied with power. Thus, the SOC of the battery 20 rises at a change rate lower than that of the SOC during the constant power control. The remaining charge time decreases with increase in the SOC.

At time (tb), due to the additional charge control, the command power develops according to the sequence of the additional charge control. At time (tb), by performing the additional charge once by the charge control unit 57, the additional charge counter is counted up by one. At completion of the first additional charge (time (tb1)), the remaining charge calculation unit 58 subtracts from the remaining charge time a predetermined time.

The charger control unit 57 performs a second additional charge, and the additional charge counter is counted up second time. Further, at completion of the second additional charge (time (tb2)), the remaining charge calculation unit 58 subtracts from the remaining charge time a predetermined time. At the time of time (tc), a full-charge flag is set and the LBC 50 ends the charge control.

Figure 8:
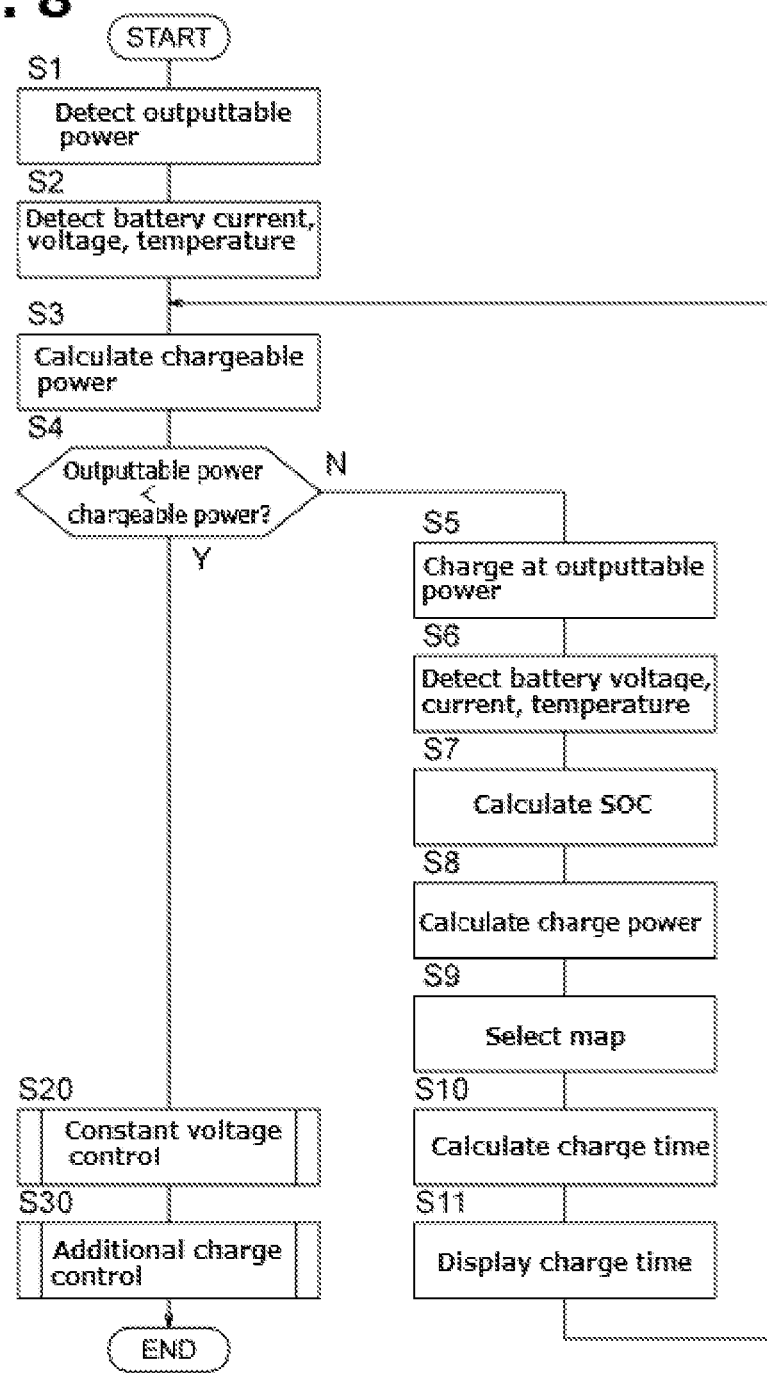
FIG. 8 is a flowchart showing a control procedure of LBC in FIG. 1.
Figure 9:
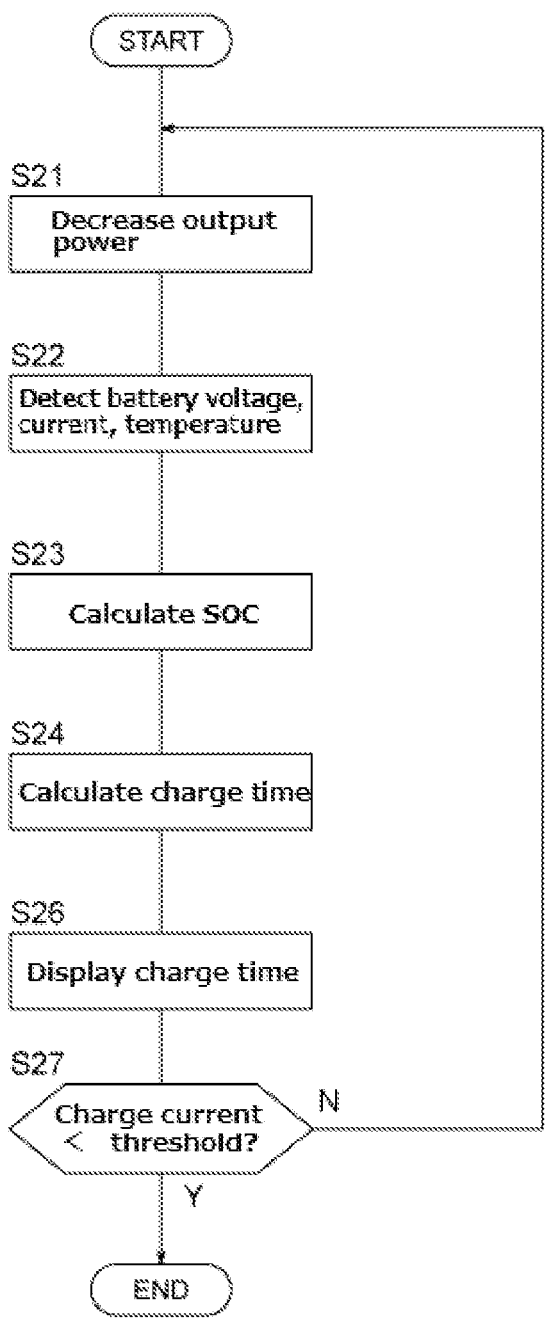
FIG. 9 is a flowchart showing a constant voltage control in FIG. 8.
Figure 10:
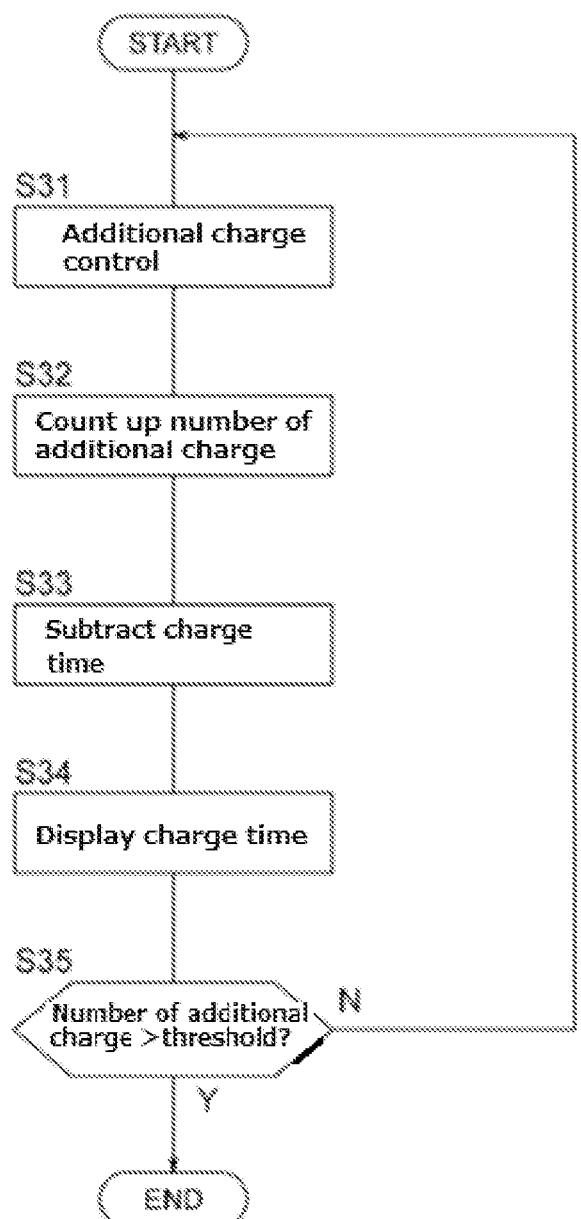
FIG. 10 is a flowchart illustrating the additional charge control in FIG. 8.

Now, with reference to FIGS. 8-10, a description is given of the flow of charge control by the LBC 50. FIG. 8 is a flowchart showing a control procedure of LBC in FIG. 1, FIG. 9 is a flowchart showing a constant voltage control in FIG. 8, and FIG. 10 is a flowchart illustrating the additional charge control in FIG. 8, respectively.

In step S1, the charger control unit 57, upon confirming connection between the battery 20 and the charger 10, based on a signal from the charger 10, detects the outputtable power of the charger 10 and stars charging.

In step S2, the current detecting unit 51 detects a current of the battery 20, the voltage detecting unit 52 detects a voltage of the battery 20, and the temperature detecting unit 53 detects a temperature of the battery 20, respectively. In step S3, the chargeable power calculation unit 55 uses the detected values detected in step S2 and calculates a chargeable power of the battery 20.

In step S4, the charger control unit 57 compares the chargeable power and the outputtable power. When the chargeable power of the battery 20 is equal to or greater than the outputtable power of the charger 10, in step S5, the charger control unit 57 causes the charger 10 to output the outputtable power to charge the battery 20.

In step S6, during charge at the outputtable power, by way of the current detecting unit 51, the current, the voltage, and the temperature of the battery 20 are detected. In step S7, the SOC calculation unit 54 uses the detected current detected in step S6 and calculates the SOC of the battery 20.

In step S8, the actual power calculation unit 56 uses the detected current and the detected voltage detected in step S6 and calculates the charge power of the battery 20. In step S9, the remaining time calculation unit 58 selects a map that corresponds to the charge power calculated in step S7 among a plurality of maps stored in the memory 40.

Further, the rema—ining charge time calculation unit 58 refers to that map and calculates the charge time that corresponds to the battery temperature detected in step S6 and the SOC detected in step S7 as the remaining charge time (step S10). In step S11, the remaining charge time calculation unit 58 displays the remaining charge time calculated in step S10 on the display unit 30 and returns to step S3. Note that, in step S3, the chargeable power of the battery 20 is calculated by using the detected values in step S6.

In step S4, when the chargeable power of the battery 20 is below the outputtable power of the charger 10, the LBC carries out the constant voltage control as described below.

As shown in FIG. 9, in step S21, the charger control unit 57 controls the charger 10 to lower the output power of the charger 10 to a power lower than the outputtable power thereof. In step S22, during charge at the constant voltage, by way of the current detecting unit 51, the current, the voltage, and the temperature of the battery 20 are detected. In step S23, the SOC calculation unit 54 calculates the SOC of the battery by using the detected current in step S22.

In step S24, the remaining charge time calculation unit 58, by extracting a charge time that corresponds to the SOC calculated in step S23 on the map selected immediately before the constant voltage control (map selected in step S9), subtracts the time as the SOC increases to calculate the remaining charge time. In step S26, the charger control unit 57 compares the charge current of the battery detected in step S22 and the current threshold (Ib).

When the charge current is equal to or greater than the current threshold (Ib), process returns to step S21 and repeats the flow of constant voltage control. On the other hand, when the charge current is less than the current threshold (Ib), the LBC 50 ends the constant voltage control and transitions to the additional charge control in step S30.

As shown in FIG. 10, in step S31, the charger control unit 57 transmits a signal indicative of a sequence of the additional charge control and controls the charger 10. In step S32, the remaining charge time calculation unit 58 counts up the number of the additional charge. In step S33, the remaining charge time calculation unit 58 subtracts the time according to the number of additional charge performed to calculate the remaining charge time. In step S34, the remaining charge time calculation unit 58 displays the charge time.

In step S35, the charger control unit 57 compares the number of the additional charge counted in step S32 and the threshold number indicative of charging completion. When the number of the additional charge is equal to or less than the threshold number, process returns to step S31, and the LBC 50 continues the additional charge process. When the number of additional charge exceeds the threshold number, the charger control unit 57 sets a full-charge flag, and the remaining charge time calculation unit sets the charge to zero to thereby conclude the control in the present embodiment.

As described above, in the present embodiment, when the chargeable power of the battery 20 is equal to or greater than the outputtable power of the charger 10, a map is referred to, which indicates a relationship of the charge time with respect to a SOC and a charge power of the battery 20, and by being based on the calculated SOC and the calculated charge power, the remaining charge time of the battery 20 is calculated. Further, when the chargeable power is less than the outputtable power, the remaining charge time is calculated by subtracting a time according to the SOC from the remaining charge time calculated from that map. Thus, even in the case in which the remaining charge time increases on the map due to switch of the map caused by decrease in the charge power, the remaining charge time of the battery 20 that is actually calculated may be decreased. As a result, such a situation will be prevented from occurring in which, despite charging being in progress, the remaining charge time on display would increase.

Further, in the present embodiment, by referring to the map at the time at which the chargeable power reaches or matches the outputtable power for calculation of a remaining charge time and subtracting from the remaining charge time thus obtained the time according to the SOC to calculate the remaining charge time. Consequently, when transitioning from the constant power control to the constant voltage control, the remaining charge time may be reduced from the instant of switch of control over passage of charging process. As a result, the remaining charge time displayed on the display unit 30 may be presented to the user without discomfort.

Further in the present embodiment, among a plurality of maps stored in the memory 40, such a map corresponding to the charge power calculated by the actual power calculation unit 56 is selected to calculate the remaining charge time. Thus, it is possible to calculate the remaining charge time according to a charger in use among chargers with different outputtable power.

Furthermore, in the present embodiment, by referring to the map in the memory and based on a SOC of the battery, a charge power of the battery 20, and a temperature of the battery 20, the remaining charge time is calculated. Thus, the remaining charge time may be calculated according to the temperature of the battery 20.

Moreover, in the present embodiment, in an additional charge control, when calculating the remaining charge time, a subtraction value (time) is set as a function of temperature, and the remaining charge time calculation unit 58 may decrease the subtraction value as the battery temperature lowers. In the additional charge control, the characteristics of the battery 20 dictates longer charge time with decrease in temperature thereof. Thus, during the additional charge control, the remaining charge time calculation unit 58 manages the temperature of the battery 20 by the detected temperature of the temperature detecting unit 53 so that the remaining charge time is calculated to be longer by reducing the subtraction value as the battery temperature decreases. Thus, it is possible to calculate accurately the remaining charge time corresponding to the battery temperature. Further, the charge control unit 58 may set a sequence of the additional charge depending on the battery temperature, Still further, in the present embodiment, the current threshold (Ib) for switching to the additional charge control may be set based on a charge current of the battery 20 when the change rate of the SOC of the battery falls below a change rate threshold. As described above, the additional charge control is intended to be performed in the case in which the constant power control or the constant voltage control is not effective to charge due to polarization of the battery 20 and the battery 20 is in a state close to full-charge.

As a SOC characteristic of the battery 20, when the battery 20 is close to full charge, the amount of change in SOC becomes extremely small. Therefore, as a threshold value indicating that the SOC of the battery 20 shows a state close to a full charge, a predetermined amount of change is previously set as a threshold, and based on that change threshold value, the current threshold (Ib) is set. Thus, by detecting the charge current, it is possible to grasp the state close to the full charge with a small change amount in SOC to detect the time at which the additional charge control is to be implemented.

The current detecting unit 51 and the voltage detecting unit 52 correspond to the "detecting means" according to the present invention. The temperature detecting unit 53 corresponds to the "temperature detecting means". The SOC calculation unit 54 corresponds to the "charge state calculation means" according to the present invention. The chargeable power calculation unit 55 corresponds to the "chargeable power calculation unit". The charge time calculation unit 58 corresponds to the "charge time calculation means" according to the present invention. Finally, the memory 40 corresponds to the "storing means" according to the present invention.

The invention claimed is:

1. A charge control device for charging a battery with electric power output from a charger, comprising:
    a voltage sensor for detecting a voltage of the battery;
    a current sensor for detecting a current of the battery;
    a charge state calculation unit for calculating a charge state of the battery by using the voltage and the current, the charge state being indicative of battery capacity at calculation time;
    a chargeable power calculation unit for calculating, using the voltage and the current, a chargeable power with which the battery is chargeable;
    a charge power calculation unit for calculating a charge power supplied to the battery from the charger; and
    a remaining charge time calculation unit for calculating a remaining charge time of the battery, configured to on condition that the chargeable power is equal to or greater than a maximum outputtable power from the charger, calculating the remaining charge time by
receiving the charge state from the charge state calculation unit,
receiving the charge power from the charge power calculation unit,
extracting a map based in part on the charge state and charge power, the map correlates in part combinations of charge state values and charge power values to provide charge time values, and
setting the remaining charge time, using the map, to a charge time value corresponding to the charge power and charge state, and
on condition that the chargeable power is less than the maximum outputtable power, calculating the remaining charge time by
fixing the map, extracted when the chargeable power is equal to or greater than the maximum outputtable power from the charger, to be used for calculating the remaining charge time to a last charge power calculated when the chargeable power is equal to or greater than the maximum outputtable power,
receiving the charge state from the charge state calculation unit, and using the charge state to reduce the remaining charge time determined from the map.

2. The charge control device as claimed in claim 1, wherein, on condition that the chargeable power is less than the maximum outputtable power, the remaining charge time calculation unit is configured to calculate the remaining charge time by referring to the map at the time at which the chargeable power reaches the maximum outputtable power for calculation of the remaining charge time and subtracting from the remaining charge time the time according to the charge state.

3. The charge control device as claimed in claim 1, further comprising storing unit for storing a plurality of maps corresponding to each charge power, wherein the remaining charge time calculation unit is configured to calculate the remaining charge time by selecting a map corresponding to the charge power calculated by the charge power calculation unit among the plurality of the maps.

4. The charge control device as claimed in claim 1, further comprising a battery temperature sensor for detecting a temperature of the battery, wherein the map is indicative of a relationship between the charge state and the temperature of the battery, and wherein the remaining charge time calculation unit is configured to calculate the remaining charge time by referring to the map and by being based on the charge state detected by the charge state detecting unit, the charge power detected by the charge power calculation unit, and the temperature of the battery detected by the battery temperature sensor.

5. A charge time calculation method for charging a battery by a charger, comprising:
detecting, by a voltage sensor, a voltage of the battery;
detecting, by a current sensor, a current of the battery;
calculating, by a charge state calculation unit, a charge state of the battery using the detected voltage and current;
calculating, by a chargeable power calculation unit, using the detected voltage and detected current, a chargeable power with which the battery is chargeable;
calculating, by a charge power calculation unit, a charge power output to the battery from the charger;
calculating, by a remaining charge time calculation unit, a remaining charge time of the battery until the charge state will reach a predetermined charge state, by
on condition that the chargeable power is equal to or greater than a maximum outputtable power from the charger, by
receiving the charge state from the charge state calculation unit,
receiving the charge power from the charge power calculation unit,
extracting a map based in part on the charge state and charge power, the map correlates in part combinations of charge state values and charge power values to provide charge time values, and
setting the remaining charge time using the map, to a charge time value corresponding to the charge power and charge state, and
on condition that the chargeable power is less than the maximum outputtable power, by
fixing the map, extracted when the chargeable power is equal to or greater than the maximum outputtable power from the charger, to be used for calculating the remaining charge time to a last charge power calculated when the chargeable power is equal to or greater than an outputtable power, and
subtracting, from the remaining charge time calculated using the map, time according to the charge state; and
displaying, on a display unit by the remaining charge time calculation unit, the remaining charge time.

* * * * *